(12) United States Patent
Delprat et al.

(10) Patent No.: US 11,373,898 B2
(45) Date of Patent: Jun. 28, 2022

(54) METHOD FOR MANUFACTURING A SEMICONDUCTOR ON INSULATOR TYPE STRUCTURE BY LAYER TRANSFER

(71) Applicant: Soitec, Bernin (FR)

(72) Inventors: Daniel Delprat, Crolles (FR); Damien Parissi, Saint-Paul-De-Varces (FR); Marcel Broekaart, Theys (FR)

(73) Assignee: Soitec, Benin (FR)

( * ) Notice: Subject to any disclaimer, the term of this patent is extended or adjusted under 35 U.S.C. 154(b) by 0 days.

(21) Appl. No.: 16/969,350

(22) PCT Filed: Feb. 12, 2019

(86) PCT No.: PCT/EP2019/053427
§ 371 (c)(1),
(2) Date: Aug. 12, 2020

(87) PCT Pub. No.: WO2019/155081
PCT Pub. Date: Aug. 15, 2019

(65) Prior Publication Data
US 2021/0050250 A1   Feb. 18, 2021

(30) Foreign Application Priority Data
Feb. 12, 2018 (FR) ........................ 1851165

(51) Int. Cl.
*H01L 21/46* (2006.01)
*H01L 23/58* (2006.01)
(Continued)

(52) U.S. Cl.
CPC .. *H01L 21/76254* (2013.01); *H01L 21/02002* (2013.01); *H01L 21/67781* (2013.01);
(Continued)

(58) Field of Classification Search
CPC ..... H01L 21/76254; H01L 2221/68363; B81C 2201/0191; B81C 2201/115
(Continued)

(56) References Cited

U.S. PATENT DOCUMENTS 8,575,002 B2    11/2013  Broekaart et al.
8,802,539 B2 *  8/2014   Allibert ............ H01L 21/02126
                                                    438/458
(Continued)

FOREIGN PATENT DOCUMENTS

TW         330307        4/1998
TW       200931503 A     7/2009
TW       201214612 A     4/2012

OTHER PUBLICATIONS

French Search Report and Written Opinion from French Application No. 1851165, dated Feb. 2, 2018, 7 pages.
(Continued)

*Primary Examiner* — Calvin Lee
(74) *Attorney, Agent, or Firm* — TraskBritt

(57) ABSTRACT

A method for manufacturing a semiconductor on insulator type structure by transfer of a layer from a donor substrate onto a receiver substrate, comprises: a) the supply of the donor substrate and the receiver substrate, b) the formation in the donor substrate of an embrittlement zone delimiting the layer to transfer, c) the bonding of the donor substrate on the receiver substrate, the surface of the donor substrate opposite to the embrittlement zone with respect to the layer to transfer being at the bonding interface, and d) the detachment of the donor substrate along the embrittlement zone. A step of controlled modification of the curvature of the donor substrate and/or the receiver substrate is performed before the bonding step.

20 Claims, 7 Drawing Sheets

(51) Int. Cl.
*H01L 21/762* (2006.01)
*H01L 21/02* (2006.01)
*H01L 21/677* (2006.01)

(52) U.S. Cl.
CPC . *B81C 2201/0191* (2013.01); *B81C 2201/115* (2013.01); *H01L 2221/68363* (2013.01)

(58) Field of Classification Search
USPC ................. 257/254, 643; 438/52, 455, 457
See application file for complete search history.

(56) References Cited

U.S. PATENT DOCUMENTS

| | | | | |
|---|---|---|---|---|
| 9,011,598 B2* | 4/2015 | Boussagol | ........ | H01L 21/76254 117/3 |
| 9,242,444 B2* | 1/2016 | Faure | ................ | H01L 21/76254 |
| 9,716,029 B2* | 7/2017 | Lallement | ......... | H01L 21/76254 |
| 10,903,263 B2* | 1/2021 | Schwarzenbach | .......................... | H01L 27/14601 |
| 10,924,081 B2* | 2/2021 | Broekaart | .......... | A61B 5/14546 |
| 2006/0024917 A1 | 2/2006 | Henley et al. | | |
| 2006/0292822 A1 | 12/2006 | Xie | | |
| 2010/0167499 A1 | 7/2010 | Fournel et al. | | |
| 2010/0167500 A1* | 7/2010 | Chhaimi | ........... | H01L 21/76254 438/458 |
| 2020/0343441 A1* | 10/2020 | Ghyselen | .............. | H01L 41/313 |

OTHER PUBLICATIONS

International Search Report from International Application No. PCT/EP2019/053427, dated Apr. 17, 2019, 3 pages.

International Written Opinion from International Application No. PCT/EP2019/053427, dated Apr. 17, 2019, 6 pages.

Taiwanese Office Action and Search Report for Application No. 108104621 dated Jan. 14, 2022, 10 pages.

* cited by examiner a)

b)

Bw    0    49 μm    89 μm    136 μm    181 μm

METHOD FOR MANUFACTURING A SEMICONDUCTOR ON INSULATOR TYPE STRUCTURE BY LAYER TRANSFER

CROSS-REFERENCE TO RELATED APPLICATIONS

This application is a national phase entry under 35 U.S.C. § 371 of International Patent Application PCT/EP2019/053427, filed Feb. 12, 2019, designating the United States of America and published as International Patent Publication WO 2019/155081 A1 on Aug. 15, 2019, which claims the benefit under Article 8 of the Patent Cooperation Treaty to French Patent Application Serial No. 1851165, filed Feb. 12, 2018.

TECHNICAL FIELD

The present disclosure relates to the manufacture of a semiconductor on insulator type structure by transfer of a layer from a substrate, designated "donor substrate" onto another substrate, designated "receiver substrate".

BACKGROUND

The manufacture of semiconductor on insulator, designated SeOI, type structures, in particular, silicon on insulator (SOI) when the semiconductor material is silicon, generally takes place according to a method consisting in transferring a layer from a donor substrate onto a receiver substrate.

In accordance with this type of method, in the donor substrate is created a so-called "embrittlement" zone, which delimits a layer to transfer, the donor substrate is bonded on the receiver substrate, then the donor substrate is detached along the embrittlement zone, so as to transfer the layer onto the receiver substrate.

A well-known layer transfer method is the Smart Cut™ method, wherein the embrittlement zone is created by implantation of hydrogen and/or helium atoms in the donor substrate to a predetermined depth, which substantially corresponds to the thickness of the layer to transfer.

An example of Smart Cut™ method is illustrated in FIG. 1. The donor substrate A and/or the receiver substrate B provided initially (step 1), generally made of silicon, are firstly oxidised (step 2) over a thickness making it possible to obtain an oxide layer 10. An embrittlement zone (step 3) is next formed in the donor substrate A, which delimits the layer 11 to transfer, by atomic implantation.

The substrates A and B next undergo a surface treatment aiming to enable a hydrophilic molecular bonding, then are bonded (step 4) to each other via their treated surfaces, which thus form the bonding interface. The oxide layer(s) 10 present at the interface is (are) called "buried oxide layer" (BOX).

A detachment (step 5) of the donor substrate along the embrittlement zone makes it possible to transfer the layer 11 onto the receiver substrate B. This step, also called fracturing or splitting step, may be carried out, for example, during a thermal annealing of the multilayer structure obtained.

The initiation of the detachment takes place thermally through the growth of micro-fissures at the level of the embrittlement zone. These micro-fissures, dispersed in the depth of the structure, merge step by step so as to form a fracture line that propagates in the entire plane of the embrittlement zone, thus ending up in the separation of the SOI structure and the remainder of the substrate B.

At the end of this transfer, the free surface of the transferred layer 11, which is opposite to the surface of the donor substrate A bonded on the receiver substrate B, has a considerable micro-roughness. This roughness is indicative of the propagation of the fracture step by step between the micro-fissures. FIG. 2 is a sectional photograph taken by transmission electron microscopy (TEM) of a silicon layer 12 of the donor substrate after implantation of hydrogen atoms followed by a thermal annealing. This figure illustrates a fracture line 13 indicative of the propagation of the fracture between the micro-fissures. The detachment of the SOI structure and the remainder of the donor substrate follows this fracture line and ends up in a surface having a considerable micro-roughness.

The roughness greatly influences the performances of the electronic devices formed in or on the transferred layer. For example, considerable roughness induces great variability in the threshold voltages of the transistors manufactured in or on this layer.

In addition, the roughness perturbs the inspection of the defects carried out by laser diffraction on the final SOI structure. Indeed, the roughness as well as the presence of slight surface holes perturb the measurement or even prevent controlling the defectiveness of the SOI structure at the lower inspection threshold.

To repair the surface and to reduce the roughness thereof, it is common to subject the SOI structure to finishing treatments (step 6), by thermal, mechanical and/or chemical smoothing. These treatments more specifically aim at obtaining a desired thickness of SOI, with a smooth surface and a consolidated bonding interface.

These treatments, although partially attenuating the surface defects, generally do not make it possible to attain an optimal surface state required for the applications of the final SOI structure.

BRIEF SUMMARY

An aim of the present disclosure is to propose a layer transfer method, for the manufacture of a semiconductor type structure, which makes it possible to reduce significantly the roughness of the free surface of the transferred layer.

The present disclosure aims more specifically to design such a layer transfer method, making it possible to reduce the roughness of the free surface of the transferred layer by controlling the formation and the evolution of the fracture line during the corresponding detachment or splitting step.

To this end, the present disclosure proposes a method for manufacturing a semiconductor on insulator type structure by transfer of a layer from a donor substrate onto a receiver substrate, comprising the following steps:

a) the supply of the donor substrate and the receiver substrate, b) the formation in the donor substrate of an embrittlement zone delimiting the layer to transfer, c) the bonding of the donor substrate on the receiver substrate, the surface of the donor substrate opposite to the embrittlement zone with respect to the layer to transfer being at the bonding interface, d) the detachment of the donor substrate along the embrittlement zone enabling the transfer of the layer to transfer onto the receiver substrate, the transfer method being characterized in that it comprises, before the bonding step, a step of controlled modification of the curvature of the donor substrate and/or the receiver substrate so as to move the substrates away from each other at least in one region of their periphery, the face or the two faces intended to form the bonding interface of the donor substrate and/or the receiver substrate being deformed so as to have a curvature amplitude (Bw) greater than or equal to 136 µm.

The fact of modifying in a global manner the curvature of the substrate(s) before bonding, by imposing a predetermined mechanical stress on them, makes it possible, during bonding, to store in the multilayer structure obtained an additional mechanical energy corresponding to the stress, compared to a bonding carried out without prior deformation of the substrates.

This additional energy is released during the detachment of the donor substrate, which may be initiated notably by any known method, for example, by application of a mechanical stress or by a thermal treatment, and facilitates the maturation of the micro-fissures and thus the formation of the fracture line. The initiation and unwinding of the detachment step are facilitated, which ends up in a reduction of the roughness of the free surface of the transferred layer at the end of the method.

According to other aspects, the proposed method has the following different characteristics taken alone or according to all technically possible combinations thereof:
  according to a first embodiment, the curvature of the donor substrate and/or the receiver substrate is modified in a global manner;
  the step of controlled modification comprises the deposition of an additional layer on at least one of the faces of the substrate concerned, the additional layer being made of a material of which the thermal expansion coefficient is different from that of the material of the substrate, the material of the additional layer being chosen so as to impose on the substrate a controlled mechanical stress capable of deforming it;
  the deposition of the additional layer is carried out on the two faces of the substrate, the additional layers of the first and second faces being made of materials having thermal expansion coefficients different from each other, the materials of the additional layers being chosen so as to impose on the substrate a controlled mechanical stress capable of deforming it;
  the deposition of the additional layer is carried out on the two faces of the substrate, the additional layers deposited on the first and the second face having different thicknesses, the difference in thickness being chosen so as to impose on the substrate a controlled mechanical stress capable of deforming it;
  the deposition of the additional layers is followed by the removal of at least one part of at least one of the additional layers;
  the method comprises, before bonding, the deposition of a polycrystalline silicon charge trapping layer on the receiver substrate;
  the step of controlled deformation comprises the oxidation of at least one superficial region of the donor substrate and/or the receiver substrate to impose on said substrate a controlled mechanical stress capable of deforming it;
  the receiver substrate comprising a polycrystalline silicon charge trapping layer, the oxidation of the substrate comprises the oxidation of the charge trapping layer;
  the deposition of the additional layer is carried out by chemical vapour deposition in a reactor;
  the donor substrate and the receiver substrate are both deformed in a convex manner;
  according to a second embodiment, the curvature of the donor substrate and/or the receiver substrate is modified in a local manner;
  the step of controlled deformation of the donor and/or receiver substrate comprises the following steps:
    the positioning of the receiver substrate on the surface of a support provided with grooves, the face of the receiver substrate intended to form the bonding interface being opposite to the surface of the support,
    the application in the grooves of a first pressure less than a second pressure applied on the face of the receiver substrate intended to form the bonding interface,
  the face or the two faces intended to form the bonding interface of the donor substrate and/or the receiver substrate are deformed so as to have a curvature amplitude greater than or equal to 180 µm, preferably greater than or equal to 250 µm.

The present disclosure also relates to a method for reducing the roughness of the exposed surface of a semiconductor on insulator type structure, characterized in that it comprises the formation of the structure by the method that has been described above, the exposed surface being obtained after detachment of the donor substrate along the embrittlement zone.

BRIEF DESCRIPTION OF THE DRAWINGS

Other advantages and characteristics of the present disclosure will become clear on reading the following description given by way of an illustrating and non-limiting example, while referring to the appended figures, which represent.

DETAILED DESCRIPTION

The proposed method makes it possible to manufacture SOI type multilayer structures by transfer of a layer of interest, in which the free surface of the transferred layer of interest has reduced roughness with respect to the prior art. The method is based on the control of the modification, before bonding, of the curvature of the donor and/or receiver substrates.

A layer transfer method conventionally consists in forming an embrittlement zone delimiting the layer to transfer in the donor substrate. According to the Smart Cut™ method, the embrittlement zone is formed by implantation of hydrogen and/or helium ions to a determined depth of the donor substrate. The chosen depth determines the thickness of the layer to transfer.

The surfaces of the donor and receiver substrates to bond next undergo a suitable treatment to enable a later hydrophilic molecular bonding of these surfaces.

After bonding, the multilayer structure is subjected to a thermal annealing and the donor substrate is detached from the receiver substrate along the embrittlement zone, thereby enabling the transfer of the layer to transfer onto the receiver substrate.

In accordance with the proposed method, prior to the bonding of the substrates, a controlled stress is applied to at least one of the two substrates in order to modify the curvature of the substrate so as to move the substrates away from each other at least in one region of their periphery. In other words, the distance between a zone of the periphery of a substrate and the zone of the periphery of the other substrate intended to be in contact therewith during the bonding step is greater after modification of the curvature of the substrate(s) concerned.

The curvature may be modified in a global manner in a concave or convex sense, or instead in a local manner.

"Curvature modified in a global manner" is taken to mean that the curvature of the substrate overall is modified in order to take a concave or convex shape. When the substrate has a disc shape, it has after deformation a generally parabolic shape.

The terms "convex" and "concave" should be understood with respect to the curvature of the face of the substrate intended to form the bonding interface, designated "front face". Hence, the substrate is designated "convex" when the curvature of the front face is convex, and is designated "concave" when the curvature of the front face is concave.

"Curvature modified in a local manner" is taken to mean that only one region (including at least one zone of the periphery) of the substrate is deformed.

Whether global or local, the modification of the curvature does not result in a modification of the thickness of the substrate.

Figure 1:
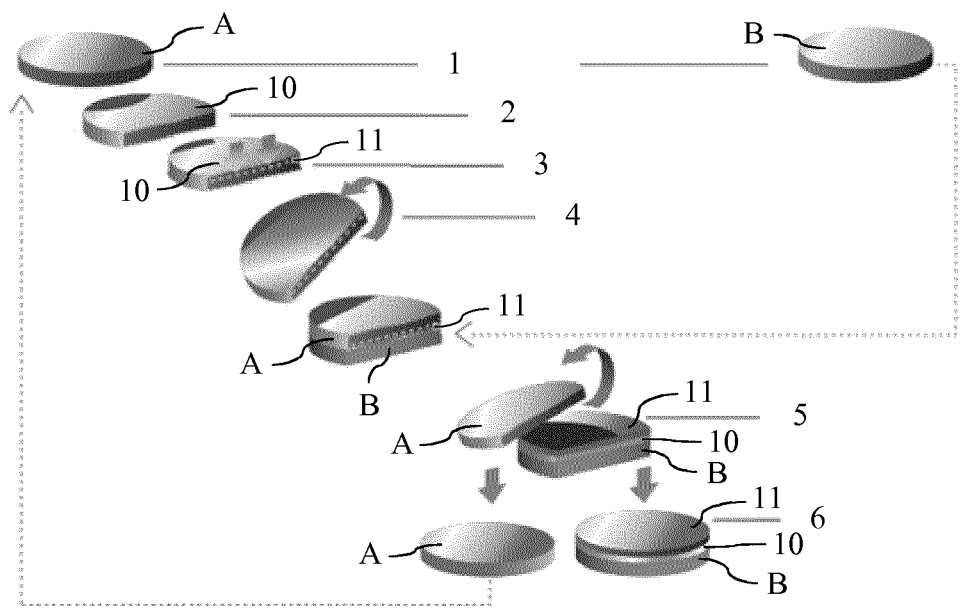
FIG. 1, a diagram that illustrates a Smart Cut™ type method for manufacturing a semiconductor on insulator type structure, by transfer of a layer from a donor substrate onto a receiver substrate.
Figure 2:
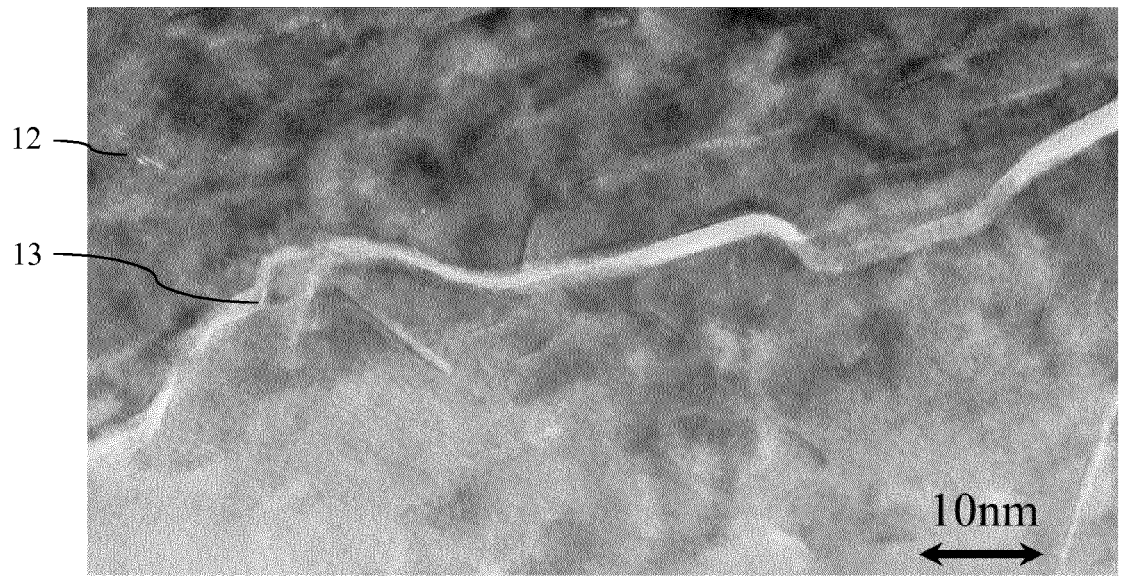
FIG. 2, a sectional photograph taken by transmission electron microscopy (TEM) of a silicon layer of the donor substrate after implantation of hydrogen atoms followed by a thermal annealing.
Figure 3A:
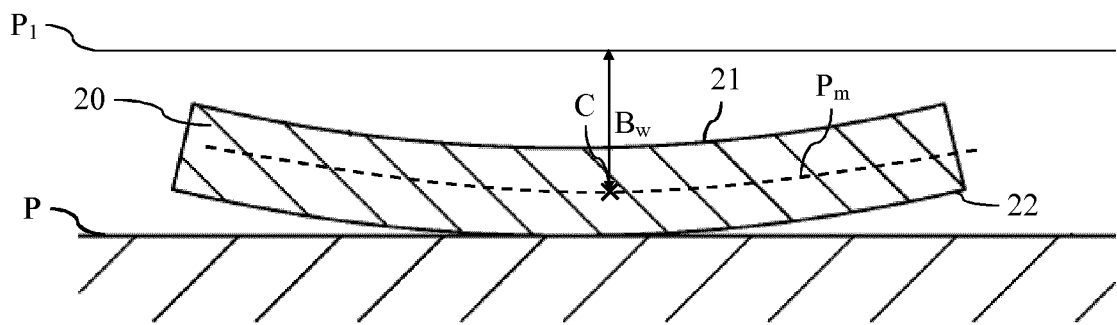
FIGS. 3A and 3B, a sectional view of a donor or receiver substrate having a controlled global curvature, respectively, concave and convex.
Figure 3B:
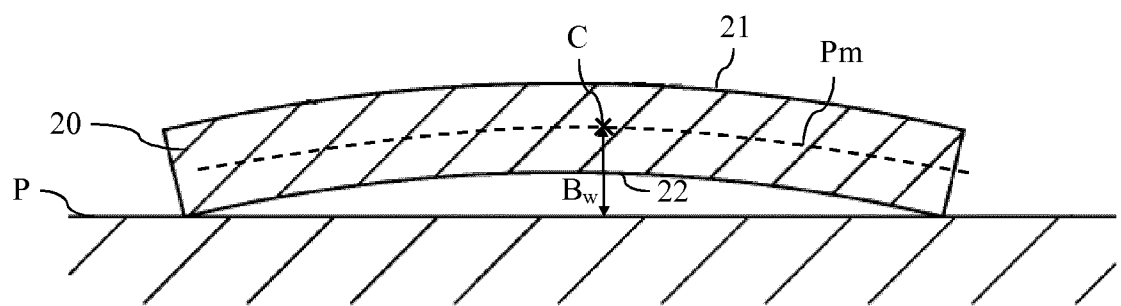

An example of substrate having a global concave or convex curvature is represented in FIGS. 3A and 3B, respectively.

The substrate 20 of FIG. 3A rests freely on a flat reference support P, typically perfectly flat, and has been deformed in a concave manner. The front face 21 (intended to form the bonding interface) is the upper face. The rear face 22, opposite to the front face 21, is parallel to the front face, the substrate 20 having a substantially constant thickness.

The substrate 20 represented in FIG. 3B has been deformed in a convex manner. The front face 21 is the upper face. The rear face 22 is parallel to the front face 21.

The curvature of the substrate is typically quantified by an amplitude parameter called "bow" and noted Bw, and/or by a warping parameter called "warp" and noted Wp.

Bw corresponds to the distance between the central point C of the median plane Pm (represented in dashed lines) of the substrate and a reference plane P corresponding to a reference support on which the substrate rests. In FIG. 3A, the calculation is carried out by using the projection P1 of the reference support P on the front face of the substrate. Bw is negative in the case of a concave curvature, in accordance with FIG. 3A, and positive in the case of a convex curvature, in accordance with FIG. 3B.

The substrate is deformed so as to have a curvature amplitude parameter Bw greater than or equal to 136 µm. There is therefore a sharp decrease in the roughness of the exposed surface of the SOI structure obtained after detachment of the donor substrate and transfer of the layer to transfer onto the receiver substrate. The exposed surface is that of the transferred layer.

This reduction in roughness is greater than what was expected, and is even more pronounced when the substrate is deformed so as to have a curvature amplitude parameter Bw greater than or equal to 180 µm, or even greater than or equal to 250 µm.

In FIGS. 3A and 3B, Wp is zero since the substrate is deformed without warping.

The substrates in their initial state may already have a specific curvature, to which correspond the parameters Bw and Wp. In this case, at least one of the substrates is deformed in accordance with what has been described previously. It will be preferred however to deform the substrate in the sense of its initial curvature, in order to reduce the risks of rupture. Thus, if the substrate has a specific concave curvature, it will be deformed in a concave manner. Respectively, if the substrate has a specific convex curvature, it will be deformed in a convex manner.

For the implementation of the method, it suffices that the curvature of at least the donor substrate or the receiver substrate is modified in a global and controlled manner during the bonding step so as to move away from each other at least one peripheral zone of the substrates. The energy accumulated in one or the other of the substrates during their deformation is thereby released in an optimal manner from the peripheral zone during the detachment of the donor substrate.

Furthermore, the donor and receiver substrates are preferably bonded by free bonding, that is to say that the substrates can freely change spatial conformation after bonding in order to adapt to each other. This change of conformation may, for example, consist in a change of amplitude parameter Bw, or instead warping parameter Wp.

For example, a donor substrate curved in a convex manner with an amplitude parameter Bw of 30 µm before bonding may have, after bonding to a receiver substrate that is substantially flat in its initial state, an amplitude parameter Bw of 15 µm, still in a convex conformation.

The preferred combinations in the case of a global deformation are presented hereafter with reference to FIGS. 4A, 4B, 4C, and 4D, the substrates being represented in their position preceding their placing in contact with a view to bonding.

Figure 4A:
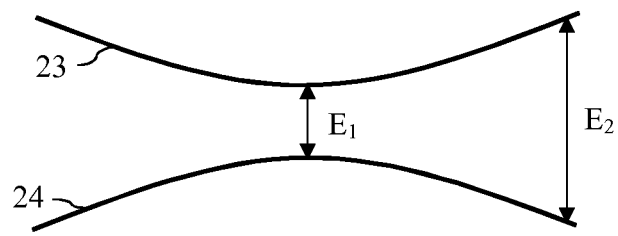
FIGS. 4A, 4B, 4C, and 4D, schematic representations of several configurations of the donor substrate and the receiver substrate at the bonding interface.

With reference to FIG. 4A, a convex curvature is imposed on each of the donor substrate and the receiver substrate. In this first configuration, the two substrates 23, 24 are deformed so as to move away from each other in the direction of their periphery and up to their periphery. The distance $E_2$ between the substrates at their periphery is then much greater than the distance $E_1$ at their central part. This configuration is preferred because it provides the final structure with an additional accrued energy compared to the other configurations, which even further reduces the roughness of the transferred layer.

Figure 4B:
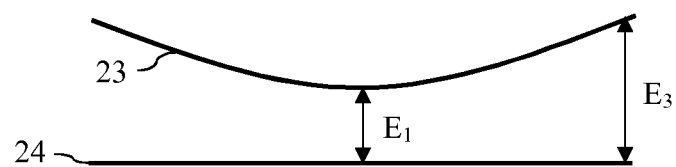

With reference to FIG. 4B, a convex curvature is imposed on the donor substrate and the receiver substrate is in its initial state, which may be flat or have a specific curvature. In this second configuration, the donor substrate is deformed so as to move away from the receiver substrate toward its periphery and up to its periphery. The distance $E_3$ between the substrates at their periphery is then greater than the distance $E_1$ at their central part, although less than the distance $E_2$ of the first configuration for a same amplitude parameter Bw of the donor substrate.

Figure 4C:
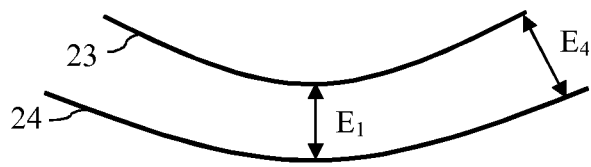

With reference to FIG. 4C, a convex curvature is imposed on the donor substrate and a concave curvature on the receiver substrate, the amplitude parameter Bw of the donor substrate being greater than that of the receiver substrate. In this third configuration, the donor substrate and the receiver substrate are both deformed in the same sense. Since the amplitude parameter Bw of the donor substrate is greater than that of the receiver substrate, the distance $E_4$ between the substrates at their periphery is greater than the distance $E_1$ at their central part, although less than the distance $E_2$ of the first configuration and the distance $E_3$ of the second configuration.

Figure 4D:
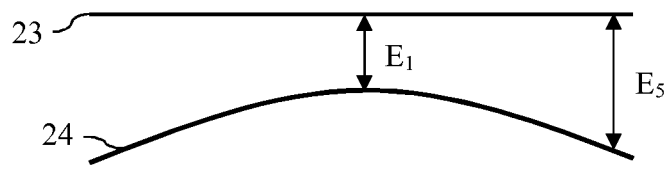

With reference to FIG. 4D, a convex curvature is imposed on the receiver substrate and the donor substrate is in its initial state, which may be flat or have a specific curvature. In this fourth configuration, the receiver substrate is deformed so as to move away from the donor substrate toward its periphery and up to its periphery. The distance $E_5$ between the substrates at their periphery is then greater than the distance $E_1$ at their central part, although less than the distance $E_2$ of the first configuration for a same amplitude parameter Bw of the receiver substrate.

According to a first embodiment, the controlled deformation of the substrate comprises a step of deposition at high temperature of an additional layer on at least one of the faces of the substrate. "High temperature" is taken to mean a temperature markedly greater than room temperature, preferably greater than 200° C., preferably greater than 500° C., and in an even more preferred manner greater than 800° C.

The additional layer is made of a material having a thermal expansion coefficient different from that of the material of the substrate. Thus, after deposition, when the temperature decreases, the additional layer and the substrate contract differently. In contracting, the additional layer applies a mechanical stress to the substrate from its deposition face, which causes a modification of the curvature of the substrate along a preferential direction, in the concave sense or in the convex sense according to the face on which the deposition has been carried out. The intensity of the mechanical stress depends on the characteristics of the additional layer, which are notably its thickness and its constituent material.

The choice of the material and the thickness of the additional layer, with regard to those of the substrate, to control the sense of the modification of the curvature, concave or convex, and to impose on the substrate a determined value of the parameter Bw, is within the reach of those skilled in the art.

In practice, the substrate is firstly placed in a reaction chamber provided for this purpose, then the reaction chamber is heated to a heating temperature determined as a function of the properties of the substrate and the additional layer to deposit. The additional layer is then deposited on the substrate. Thus, the substrate and the additional layer are heated during all or part of the deposition step. It is possible to conserve the same heating temperature during the deposition, or to vary the heating temperature during the deposition.

The adjustment of the heating temperature of the reaction chamber consequently makes it possible to adjust the temperature difference imposed on the substrate during the cooling thereof, conventionally down to room temperature, i.e., around 20° C.

The deposition of the additional layer is preferably carried out by CVD (chemical vapour deposition) in the reaction chamber. CVD is particularly suited to the deposition of an additional layer of low thickness compared to that of the substrate.

An additional layer may be deposited, in accordance with this first embodiment, on the two opposite faces of the substrate. In this case, each of the additional layers is made of a material having a thermal expansion coefficient different from that of the material of the substrate.

In addition, the additional layers may be made of a same material, or made of different materials.

When the additional layers are made of a same material, they have the same thermal expansion coefficient. Hence, care must be taken to ensure that they have a different thickness to each other in order to apply a stress capable of modifying the curvature of the substrate. This may be done during the deposition by depositing in an asymmetric manner a greater thickness of material on one face of the substrate than on the other, or instead after the deposition by a removal of a part at least of one of the additional layers from the corresponding face.

When the additional layers are made of different materials, they generally have a different thermal expansion coefficient. It is thus possible to provide two additional layers of same thickness, or instead two additional layers of different thicknesses in order to adjust in an even more precise manner the curvature of the substrate. In an analogous manner to the preceding, the difference in thickness may result in an asymmetric deposition or a removal of a part at least of an additional layer after deposition.

According to a second embodiment, the controlled deformation of the substrate is obtained by superficial thermal oxidation of the substrate. The oxidation of the material at the surface of the substrate causes the consumption of its constituent material and the formation of one or more corresponding oxide(s). The formation of the oxide induces a mechanical stress within the substrate, ending up in a modification of the curvature thereof.

This oxidation step is carried out on one of the faces of the substrate or its two faces. It preferentially corresponds to the formation of the buried oxide layer.

A face of the substrate or a face of an additional layer deposited beforehand on the substrate as described in the first embodiment is oxidised.

The oxidation of each face of the substrate mainly depends on its constituent material. Indeed, two layers made of different materials may be oxidised at different rates, and end up in the formation of different oxides and of different thicknesses. This leads to the application of different mechanical stresses on the two faces of the substrate, and ends up in a deformation of the substrate when the substrate is cooled after oxidation.

The thickness of the oxidised layer on each face also depends on the oxidation time. An extended oxidation makes it possible to oxidise a greater thickness of layer, compared to a shorter oxidation.

Figure 5:
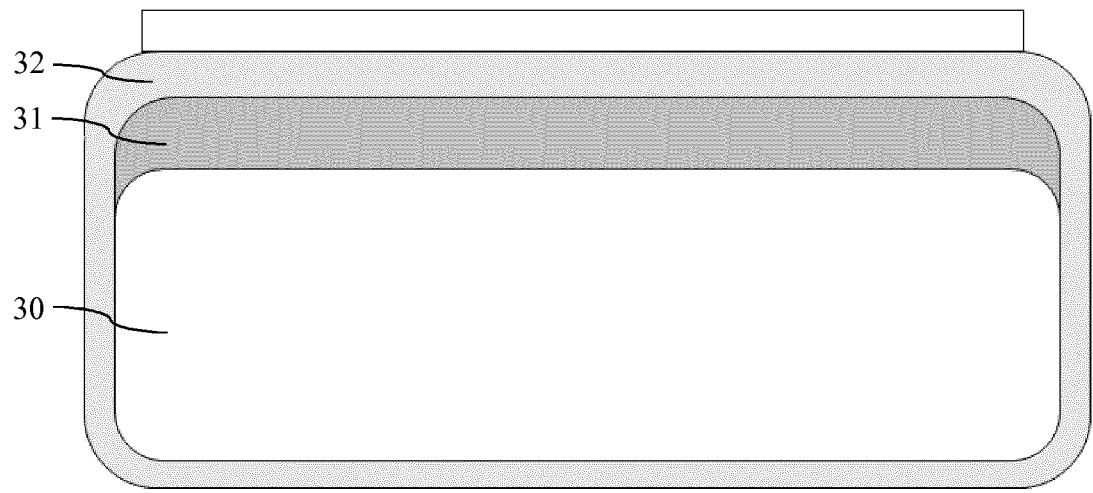
FIG. 5, a sectional diagram of a SOI type structure according to an embodiment, comprising a polysilicon layer between an oxide layer and a transferred silicon layer.

An exemplary embodiment, represented in FIG. 5, concerns SOI structures manufactured on a substrate made of highly resistive silicon, with a polysilicon (polycrystalline silicon) trapping layer 31 between the oxide layer 32 and the initial substrate 30. The polysilicon trapping layer 31 has been deposited on a silicon substrate 30, then oxidised, thus ending up in a considerable modification of the curvature of the substrate. Indeed, the oxidation at high temperature, here between 800° C. and 1100° C., is faster on the polysilicon layer than on the opposite face of the substrate, which leads to a great difference in thickness of oxide between the two faces of the substrate. This leads to the application of different mechanical stresses on the two faces of the substrate, and to a considerable deformation of the substrate when the substrate is taken to room temperature after oxidation. As an example, curvatures of around 130 μm to 140 μm of silicon substrates of 300 mm diameter have been obtained for an oxidation of 0.25 μm of the polysilicon layer, and curvatures of around 240 μm to 250 μm of silicon substrates of 300 mm diameter have been obtained for an oxidation of 0.5 μm of the polysilicon layer.

According to a third embodiment, the substrate is deformed by application of mechanical stresses thanks to a support or "chuck".

Figure 6:
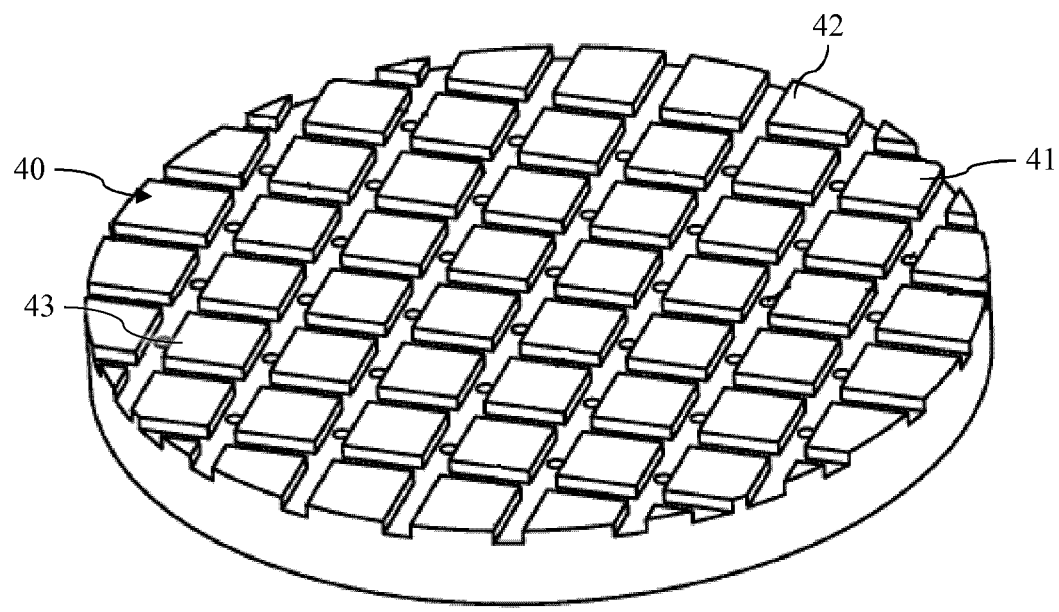
FIG. 6, a perspective diagram of a support or "chuck"

Such a support is represented in FIG. 6. This support 40 is configured to receive a substrate, of which one face comes into contact with the contact surface 41 of the support. The support is provided with grooves 42 on its contact surface, typically distributed in a regular manner on the surface. In the embodiment of the support represented in FIG. 6, the grooves extend along two series of parallel grooves, the series of grooves being perpendicular with each other and forming a grid pattern that extends over the entire contact surface of the support. The grooves are equipped with vacuum drawing means, which are advantageously in the form of orifices 43 arranged in the grooves in fluidic connection with a vacuum pump.

The support 40 is placed in a chamber provided for this purpose, and a substrate is positioned on the support. A vacuum is next drawn in the grooves thanks to the vacuum drawing means. The pressure P1 of the zone situated between the substrate and the support decreases, which creates a pressure differential ΔP between the pressure P1 and the pressure P2 of the chamber, such that ΔP=P1−P2<0. This pressure difference applied at the level of different zones of the substrate induces a mechanical stress on the contact surface of the substrate. Under the effect of this stress, portions of the substrate bearing against the support 40 then deform locally. Obviously, a pressure differential may be applied at the level of a single portion or several portions of the substrate, so as to deform locally one or more peripheral zones of the substrate.

Those skilled in the art are able to configure the support 40 and the application of the vacuum so as to deform locally the substrate in the desired zone(s).

It is possible to adjust the pressures P1 and P2 so as to obtain a high ΔP, greater than a minimum ΔP. When ΔP>minimum ΔP, the substrate is pressed against the support and is fixed to the latter, which corresponds to a "clamping" effect.

All of the parameters of this method of deformation of the substrate using the support are adjusted so that all of the local mechanical stresses imposed on the substrate form a global mechanical stress aiming to modify the curvature of the substrate in a global manner. The experimental parameters are also adjusted so as to control the value of the parameter Bw of the substrate.

To do so, it is possible, for example, to adjust the density of orifices 43 or grooves 42 on the surface of the support in order that these are more numerous at the level of the central part of the support compared to its peripheral part. It is also possible to adjust the width of the grooves or the orifices, or instead their orientation relative to the substrate. The value of ΔP itself must be adjusted, it being understood that the greater ΔP, the greater the modification of the curvature of the substrate.

In accordance with this third embodiment, when the desired curvature is obtained, the pressures P1 and P2 are maintained, and the bonding of the second substrate, potentially deformed beforehand, is carried out on the first deformed substrate. The bonding is thus carried out while maintaining the pressure differential ΔP. During the propagation of the bonding wave, the second substrate conforms at least partially to the curvature imposed by the first substrate.

According to a fourth embodiment, it is possible to impose a mechanical stress on a substrate to generate a controlled global curvature by implementing an atomic implantation, or instead by implementing a mechanical polishing (grinding). Those skilled in the art are able to define the operating conditions for implantation or polishing to obtain a determined curvature.

EXAMPLES

Example 1

Comparison of the Defectivity and Roughness of the Exposed Surface of Two SOI Structures Two similar SOI structures noted a) and b) are made in accordance with a method for transferring a layer from a donor substrate to a receiver substrate, as described previously.

The structures a) and b) only differ by the curvature of the donor and receiver substrates:
  for the structure a), no controlled deformation is applied to the donor and receiver substrates before bonding, the substrates having a specific curvature less than 100 μm;
  for the structure b), a controlled deformation is applied to the receiver substrate before bonding, so as to impose on the substrate a convex curvature greater than 50 μm.
As indicated above, the bonding is free.

Figure 7:
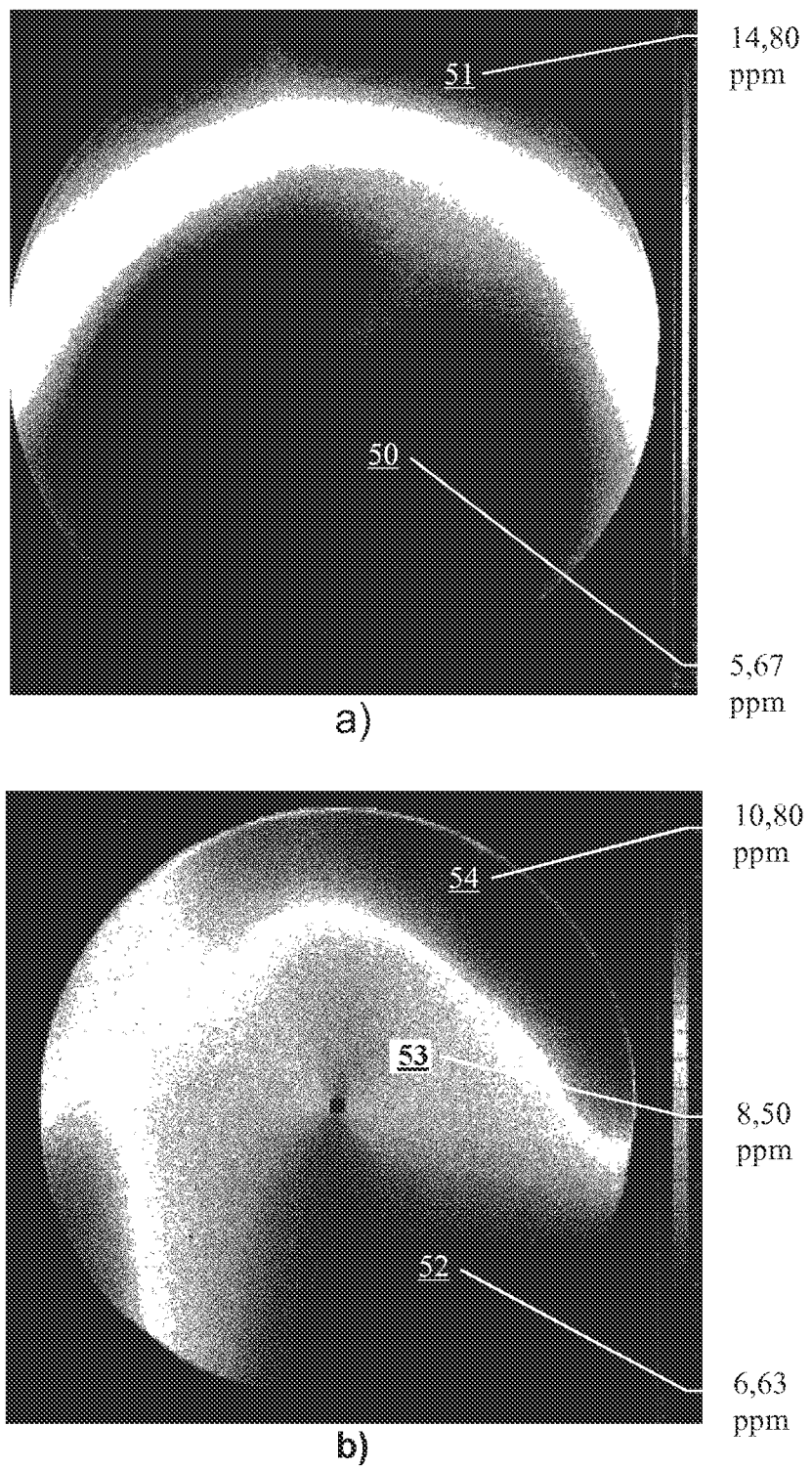
FIG. 7, a roughness mapping, designated Haze mapping, obtained by diffraction of a laser on the surface of two SOI structures obtained after detachment and thermal smoothing by thermal annealing.

FIG. 7 represents a Haze mapping obtained by diffraction of a laser on the surface of the SOI structures a) and b) respectively, after detachment and thermal smoothing by rapid thermal annealing (RTA). The laser apparatus used is of "SURFSCAN SP2" type sold by the KLA TENCOR Company.

The Haze mapping shows the intensity of the laser signal diffracted by the surface of the structure, characteristic of the roughness of the surface.

The haze measured on the surface of the structure a) is very heterogeneous, and goes from a minimum of 5.67 ppm on a large central portion 50 and below the surface, to a maximum of 14.80 ppm on a small arc-shaped portion 51 of the upper periphery of the surface, i.e., an amplitude of 14.80−5.67=9.13 ppm.

The haze measured on the surface of the structure b) is markedly more homogeneous, and goes from a minimum of 6.63 ppm on a small lower portion 52, to around 8.50 ppm on a large central zone 53, up to a maximum of 10.80 ppm on an arc-shaped portion 54 of the upper periphery of the surface, i.e., an amplitude of 10.80 ppm−6.63 ppm=4.17 ppm. The maximum haze and the amplitude of the haze measured on the surface of the structure b) are thus markedly less than those of the surface of the structure a).

Thus, the surface of the structure a) has reduced roughness, and it is distributed in a more homogenous manner, compared to the surface of the structure a).

Figure 8:
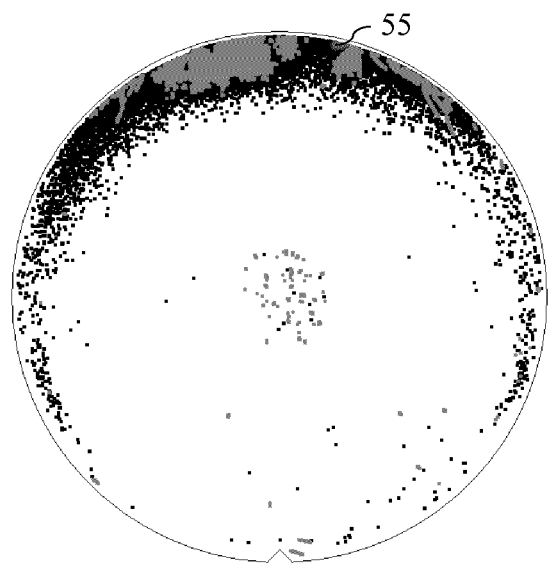
FIG. 8, a defectiveness mapping obtained by diffraction of a laser on the surface of the two SOI structures of FIG. 7.
Figure 8:
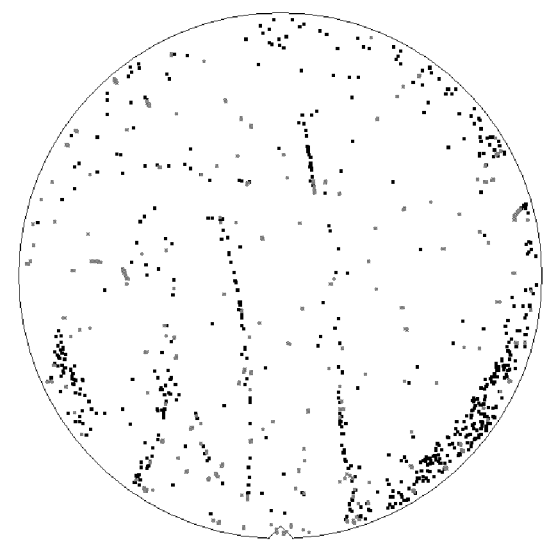

FIG. 8 represents a defectiveness mapping obtained by diffraction of a laser on the same surfaces as FIG. 7. The surface defects are detected when the diffracted laser signal exceeds a predetermined threshold intensity. The laser apparatus used is the same as that used to carry out the Haze mapping of FIG. 7.

The distribution of the defectiveness obtained in FIG. 8 substantially corresponds to that of the Haze of FIG. 7.

For the structure a), the defects are numerous, and are situated very mainly on an arc-shaped portion 55 of the upper periphery of the surface, which indicates a very heterogeneous distribution of the defectiveness.

For the structure b), the defects are not very numerous compared to the structure a). In addition, the defects are distributed in a relatively homogeneous manner over the entire surface.

Consequently, the fact of modifying in a global and controlled manner the curvature of at least one of the donor and receiver substrates before bonding has made it possible to reduce the defectiveness as well as the roughness of the exposed surface of the SOI structure obtained after detachment, and to distribute the defectiveness and the roughness in a more homogenous manner over the whole of the exposed surface.

Example 2

Evolution of the Roughness of the Exposed Surface of an SOI Structure in Function of the Curvature (BOW)

An SOI structure is fabricated according to a method of layer transfer from a donor substrate to a receiver substrate as previously described.

Controlled deformation is applied to the receiver substrate of the structure before bonding, so as to impose on the substrate a convex curvature according to different values of curvature. The bonding is free. The receiver substrate may be deformed by deposition of an additional layer, by oxidation of a surface region of the receiver substrate, or by application of mechanical stresses by means of a support (chuck).

Figure 9:
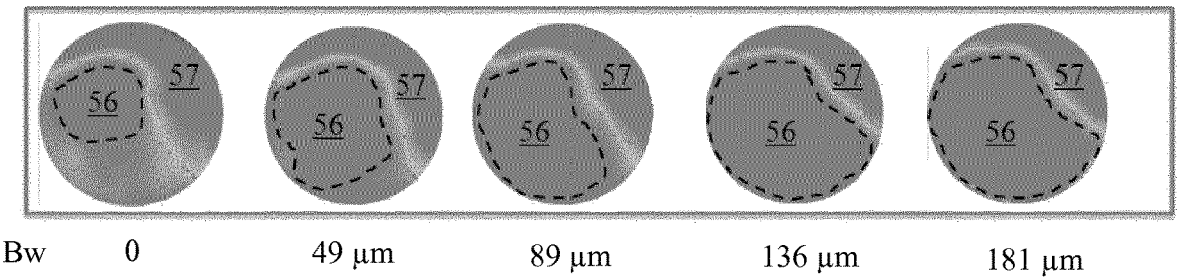
FIG. 9, a Haze mapping obtained by diffraction of a laser on the surface of an SOI structure obtained after detachment and thermal smoothing by thermal annealing, for different values of curvature (Bw)

FIG. 9 represents a Haze mapping obtained by diffraction of a laser on the surface of the SOI structure after detachment and thermal smoothing by RTA. The laser device used is of "SURFSCAN SP2" type sold by the KLA TENCOR Company.

The haze measured on the surface of the SOI structure decreases with the increase of the curvature. In fact, the zone 56, which has a haze of about 5 ppm increases as the curvature increases, to cover most of the surface. Zone 57, which has a higher haze of about 10 ppm corresponds to a substrate handling zone during the process, and thus retains substantially the same area.

Therefore, as the curvature increases, the roughness of the exposed surface of the SOI structure decreases. The roughness decreases when the curvature reaches 49 µm then 89 µm, then decreases sharply when the curvature reaches about 136 µm then 181 µm.

Figure 10:
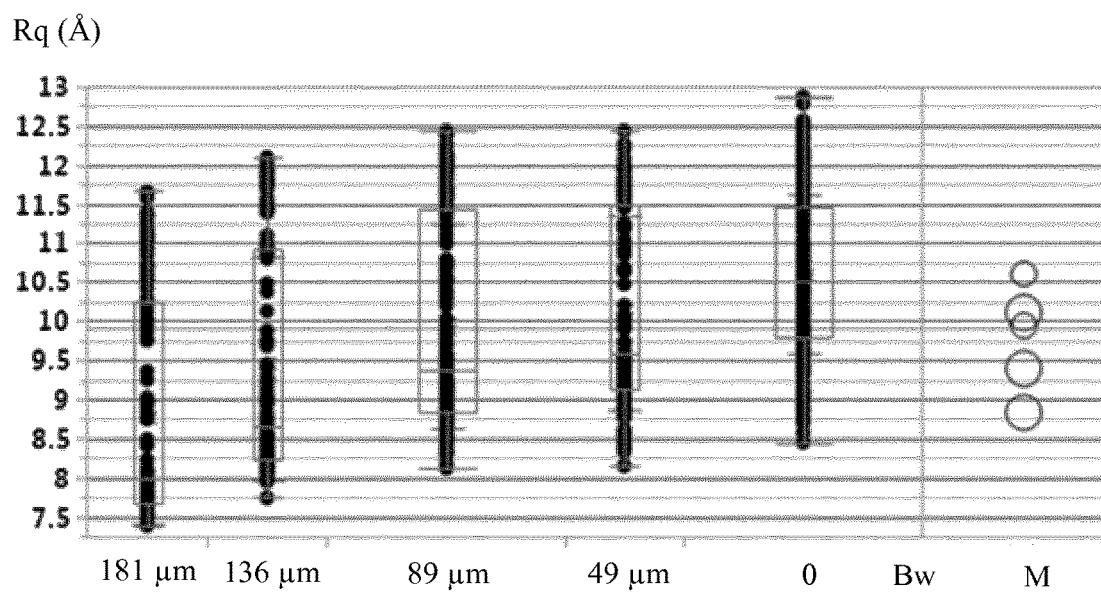
FIG. 10, a graph representing the evolution of the roughness of the exposed surface as a function of the curvature, in correspondence with the Haze mapping of FIG. 9.

FIG. 10 is a graph showing the evolution of the roughness of the exposed surface as a function of the curvature, in correspondence with the cartography of FIG. 9. The ordinate roughness is denoted Rq and is expressed in Angström (Å).

This graph confirms the results observed in FIG. 9, namely that the roughness decreases with increasing curvature. Indeed, the average value M of the roughness with no deformation is about 10.6 Å, then decreases to 10.2 Å and 9.9 Å for a curvature of 49 µm and 89 µm, respectively, and finally drops to about 9.4 Å and 8.8 Å for a curvature of 136 µm and 181 µm, respectively.

The invention claimed is:

1. A method for manufacturing a semiconductor on insulator type structure by transfer of a layer from a donor substrate onto a receiver substrate, comprising:
supplying the donor substrate and the receiver substrate;
forming, in the donor substrate, an embrittlement zone delimiting the layer to transfer;
bonding the donor substrate on the receiver substrate, a surface of the donor substrate opposite to the embrittlement zone with respect to the layer to transfer being at a bonding interface; and
detaching the donor substrate along the embrittlement zone enabling the transfer of the layer to transfer onto the receiver substrate, wherein the transfer method comprises, before bonding of the donor substrate on the receiver substrate, a step of controlled modification of a curvature of the donor substrate and/or the receiver substrate so as to move the substrates away from each other at least in one region of their periphery, a face or the two faces intended to form the bonding interface of the donor substrate and/or the receiver substrate being deformed so as to have a curvature amplitude greater than or equal to 136 µm.

2. The method of claim 1, wherein modifying the curvature of the donor substrate and/or the receiver substrate comprises:
positioning the receiver substrate on the surface of a support provided with grooves, the face of the receiver substrate intended to form the bonding interface being opposite to the surface of the support;
applying a first pressure in the grooves less than a second pressure applied on the face of the receiver substrate intended to form the bonding interface; and
wherein the bonding of the donor substrate on the receiver substrate, as well as the detaching of the donor substrate along the embrittlement zone, are carried out while maintaining the first and second pressures.

3. A method for reducing a roughness of an exposed surface of a semiconductor on insulator structure, comprising: forming the semiconductor on insulator structure by the a method according to claim 1, the exposed surface being obtained after the detaching of the donor substrate along the embrittlement zone.

4. The method of claim 1, wherein the face or the two faces intended to form the bonding interface of the donor substrate and/or the receiver substrate are deformed so as to have a curvature amplitude greater than or equal to 180 µm.

5. The method of claim 1, wherein modifying the curvature of the donor substrate and/or the receiver substrate comprises modifying the curvature of the donor substrate and/or the receiver substrate in a local manner.

6. The method of claim 1, further comprising depositing a polycrystalline silicon charge trapping layer on the receiver substrate before bonding the donor substrate on the receiver substrate.

7. The method of claim 1, wherein modifying the curvature of the donor substrate and/or the receiver substrate comprises modifying the curvature of the donor substrate and/or the receiver substrate in a global manner.

8. The method of claim 7, wherein modifying the curvature of the donor substrate and/or the receiver substrate comprises oxidizing at least one superficial region of the donor substrate and/or the receiver substrate and imposing a controlled mechanical stress on the donor substrate and/or the receiver substrate.

9. The method of claim 7, wherein modifying the curvature of the donor substrate and/or the receiver substrate comprises deforming both the donor substrate and the receiver substrate in a convex manner.

10. The method of claim 7, wherein modifying the curvature of the donor substrate and/or the receiver substrate comprises depositing an additional layer on at least one of the faces of the substrate, the additional layer being made of a material having a thermal expansion coefficient different from a thermal expansion coefficient of the material of the substrate, the material of the additional layer being chosen so as to impose on the substrate a controlled mechanical stress capable of deforming the substrate.

11. The method of claim 10, wherein depositing the additional layer is carried out on the two faces of the substrate so as to form a first additional layer on a first face of the two faces of the substrate and a second additional layer on a second face of the two faces of the substrate, the first additional layer and the second additional layer having different thicknesses, the difference in thickness being chosen so as to impose on the substrate a controlled mechanical stress capable of deforming the substrate.

12. The method of claim 10, wherein depositing the additional layer comprises depositing the additional layer by chemical vapor deposition.

13. The method of claim 10, wherein depositing the additional layer is carried out on the two faces of the substrate so as to form a first additional layer on a first face of the two faces of the substrate and a second additional layer on a second face of the two faces of the substrate, the first additional layer and the second additional layer being made of materials having thermal expansion coefficients different from each other, the materials of the first additional layer and the second additional layer being chosen so as to impose on the substrate a controlled mechanical stress capable of deforming the substrate.

14. The method of claim 13, wherein depositing the additional layer is followed by removal of at least one part of at least one of the first additional layer and the second additional layer.

15. The method of claim 13, wherein the first additional layer and the second additional layer have different thicknesses, the difference in thickness being chosen so as to impose on the substrate a controlled mechanical stress capable of deforming the substrate.

16. The method of claim 15, wherein depositing the additional layer is followed by removal of at least one part of at least one of the first additional layer and the second additional layer.

17. The method of claim 16, further comprising depositing a polycrystalline silicon charge trapping layer on the receiver substrate before bonding the donor substrate on the receiver substrate.

18. The method of claim 17, wherein modifying the curvature of the donor substrate and/or the receiver substrate comprises oxidizing at least one superficial region of the donor substrate and/or the receiver substrate and imposing a controlled mechanical stress on the donor substrate and/or the receiver substrate.

19. The method of claim 18, wherein, the oxidizing comprises oxidizing the charge trapping layer.

20. The method of claim 19, wherein, the oxidizing comprises oxidizing the charge trapping layer.

* * * * *